United States Patent [19]
Smith

[11] 3,973,863
[45] Aug. 10, 1976

[54] DRILL CHANGING DEVICE

[75] Inventor: Joseph E. Smith, Torrance, Calif.

[73] Assignee: Excellon Industries, Torrance, Calif.

[22] Filed: Jan. 10, 1975

[21] Appl. No.: 540,232

[52] U.S. Cl. .................. 408/241 R; 29/26 A; 29/568; 211/69; 279/41 R; 408/31
[51] Int. Cl.² ................................... B23Q 3/157
[58] Field of Search .............. 408/35, 31, 241 R; 29/26 A, 568; 211/1.5, 60 T, 69; 279/1 B, 1 SG, 41

[56] References Cited
UNITED STATES PATENTS

| | | | |
|---|---|---|---|
| 2,883,890 | 4/1959 | Fink et al. ...................... | 29/26 A X |
| 2,931,516 | 4/1960 | Sharp ................................. | 211/69 |
| 3,073,024 | 1/1963 | Hutchens et al. ................... | 29/568 |
| 3,171,327 | 3/1965 | Williamson ...................... | 408/35 X |
| 3,188,736 | 6/1965 | Brainard et al. ................. | 29/568 |
| 3,191,260 | 6/1965 | Jorgensen ..................... | 211/1.5 X |
| 3,604,565 | 9/1971 | Freeman ....................... | 211/69 X |
| 3,790,182 | 2/1974 | Shuman .......................... | 279/1 B X |

Primary Examiner—Othell M. Simpson
Assistant Examiner—Fred A. Silverberg
Attorney, Agent, or Firm—Gausewitz, Carr & Rothenberg

[57] ABSTRACT

This invention provides a drill changing device for a drilling machine in which a collar is provided on the shank of a drill at a predetermined location relative to the tip of the drill, the collar being frictionally gripped by a split sleeve so that the shank projects outwardly from the sleeve, the sleeve being slidable relative to a fixed support and normally biased against a shoulder on the support, allowing overtravel when the collet of a drilling machine engages the collar and receives the shank. The tip of the drill is at a predetermined position relative to the collet when the collet engages the collar so that the drill will effect proper penetration of the workpiece in a drilling operation.

11 Claims, 9 Drawing Figures

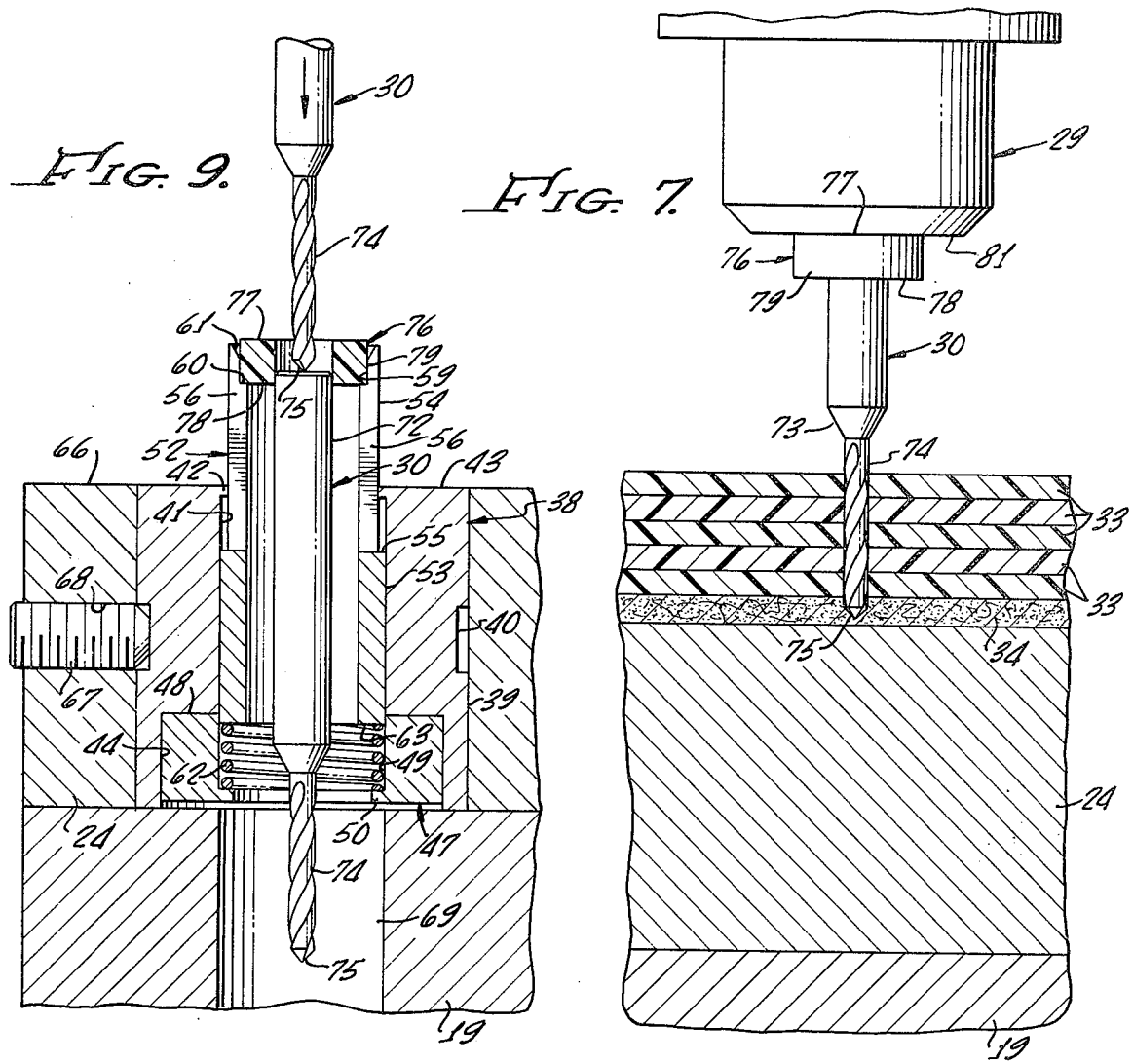
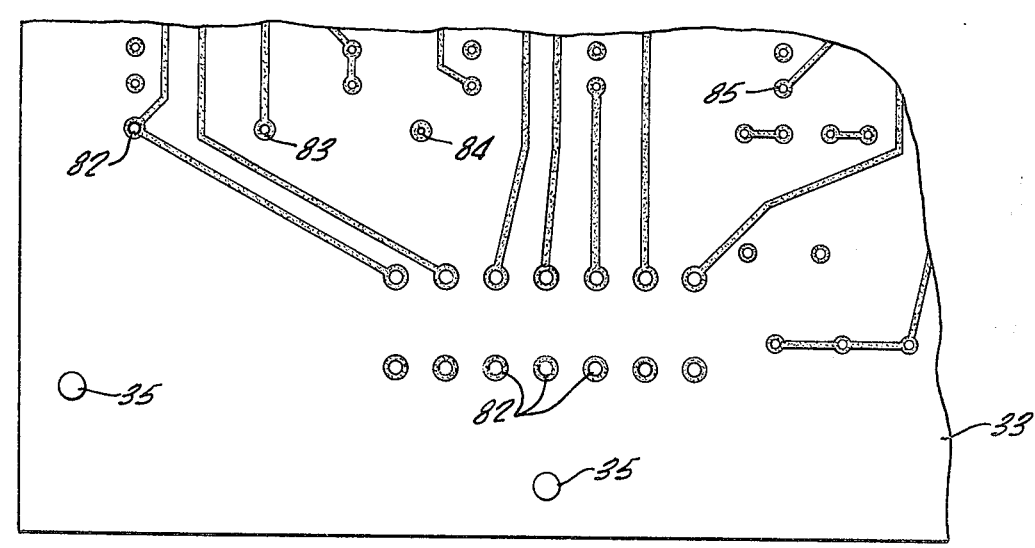

DRILL CHANGING DEVICE

BACKGROUND OF THE INVENTION

Printed circuit boards have many openings which must be drilled at precise locations. In volume production, this is accomplished by computer-controlled automatic drilling machines in which the printed circuit boards are held on a tooling plate positioned on a movable work table. The work table is moved horizontally beneath a drill spindle so that upon movement of the drill through a vertical stroke the openings in the circuit boards may be drilled at proper locations. This is a very rapid and satisfactory procedure for mass production of printed circuit boards. However, many printed circuit boards require the drilling of openings of more than one diameter, some needing openings of several different sizes. This leads to inefficiency in the drilling operation because the machines must be stopped to change drills for the drilling of the different sized openings. The result is a loss of time and therefore an increase in operating expenses.

Drill changing has been facilitated by positioning a collar on the drill shank at a known distance from the tip of the drill. The collar is engaged with the end of the collet, which thereby properly locates the tip of the drill with respect to the collet to coordinate with the stroke of the spindle. This has not alleviated the problem of stopping the machine for manually changing drills, however.

DESCRIPTION OF THE PRIOR ART

Machines have been designed in the past which provide for the automatic changing of cutting tools, as shown in U.S. Pat. Nos. 3,568,849 and 3,604,565. In these designs, a holder is provided for the cutting tool in the form of a fixed support with an opening having a shoulder inwardly of its upper end. The cutting tool or a member attached to the cutting tool has an enlarged portion to provide a shoulder that is positioned adjacent the shoulder of the tool holder. In the design of U.S. Pat. No. 3,604,565 the shoulder of the tool engages the shoulder of the support and in U.S. Pat. No. 3,568,849 spring loaded pins hold the tool in the support with the shoulders closely spaced. In the former patent, retention of the tools is accomplished by O-rings in the opening that circumscribes the shank. The shank projects beyond the support and may be engaged by the machine when the tool is to be picked up for operation. A serious problem with these designs is that there is no allowance for appreciable overtravel in the spindle of the machine when it is advanced toward the tool holder. If the spindle moves too far toward the tool holder it will push the shoulder of the tool against the unyielding shoulder of the support. The result will be damage to the parts, in all likelihood including the relatively expensive spindle of the tool. Damage also can occur if the spindle strikes the outermost part of the tool holder irrespective of whether or not the shank of the tool has been gripped.

Another difficulty lies in an inability to position the end of the cutting tool a precise distance from the element of the machine which engages the tool. As applied to a drilling machine, this would mean that the distance that the tip of the drill projects from the collet would not be known. This would be unacceptable because this distance must be set with precision so that the machine can be assured of drilling entirely through the workpiece while at the same time avoiding penetration of an element of the machine itself.

SUMMARY OF THE INVENTION

The present invention provides an improved arrangement for changing drills in a drilling machine, allowing the drills to be changed automatically and without the operator's attention, while overcoming the difficulties in the prior art noted above. The invention includes a tool support which has a fixed element that is attached to the tooling plate of the machine, releasably held in position by a set screw. The fixed element has a cylindrical opening that receives a sleeve which is slidable relative to the fixed support for a limited distance. The sleeve is biased upwardly by a compression spring to a normal position in which a shoulder on the sleeve engages a shoulder of the fixed element. The upper end of the sleeve is resilient and split, projecting from the fixed support. This part of the sleeve includes an internal portion of enlarged diameter ending at a shoulder, with a beveled entrance into its opposite end.

The drill is provided with a collar on its shank, the collar being pressed onto the shank and gripping it by friction. The collar is located so that its radial face that is remote from the drill tip is at a precise distance from the drill tip. The drill and collar then are held by the tool support with the collar received in the upper end portion of the split portion of the sleeve, its lower radial surface engaging the shoulder of the sleeve and its circumferential surface frictionally gripped by the sleeve.

The collet of the automatic drilling machine then can be extended over the shank of the drill and advanced toward the collar until it strikes the upwardly turned radial surface of the collar. The collet is advanced axially against the collar to assure that there is a firm engagement at this point. This axial movement is made possible by the compression spring which yields and allows the sleeve to be pushed downwardly as the end of the collet is forced against the end of the collar. With the collet then gripping the drill shank, the drill is removed and used to drill the openings in the workpieces. The engegement of the collet with the collar accurately positions the tip of the drill so that it will drill to the proper depth as the spindle moves through its stroke. The movement permitted the sleeve prevents damage to the components of the machine and the drill holder. The spring returns the sleeve to its original position when the collet is removed, where it awaits return of the drill following a drilling sequence.

When the drill is returned, the collet inserts the drill into the sleeve, again advancing so as to move the sleeve and compress the spring as it forces the radial surface of the collar against the shoulder of the sleeve. As during removal of the drill, damage is avoided by the movement permitted the sleeve. The collet releases the shank and is removed, with the grip of the split portion of the sleeve on the periphery of the collar holding the drill in place. The drill then is positioned again so as to be ready for pick up by the collet of the machine.

The machine is provided with several of the drill holders with drills of different sizes retained in them so that when it deposits one drill in its holder it can go on to another of a different size for drilling openings of a different diameter. The machine drills entirely automatically, taking care of all of its drill changes, so that the openings of different sizes are obtained without stopping the machine for manual change of the drill.

In the event of a malfunction in which the machine would attempt to return a drill to a holder already occupied by a drill, the drill in the holder will be pushed downwardly into an opening in the work table. This will prevent damage to the spindle of the machine.

BRIEF DESCRIPTION OF THE DRAWINGS

FIG. 3 is an enlarged side elevational view of a drill with a collar on its shank for use in the drill changing arrangement;

FIG. 4 is an exploded perspective view of a drill and the drill changer assembly;

FIG. 5 is a sectional view showing the drill changer assembly positioned in the tooling plate of the drilling machine, with the drill located in the drill changer assembly prior to engagement by the collet of the drilling machine;

FIG. 6 is a veiw similar to FIG. 5, but with the collet receiving the shank of the drill and the gripping sleeve of the drill changer assembly moved downwardly;

FIG. 7 is a sectional view illustrating the drilling operation of a drill after being gripped by the collet;

FIG. 8 is a fragmentary plan view of a printed circuit board having different sizes of openings therein after having been drilled; and FIG. 9 is a sectional view showing how a drill can be displaced from the drill changer assembly without damage to the machine in the event of malfunction.

DESCRIPTION OF THE PREFERRED EMBODIMENT

Figure 1:
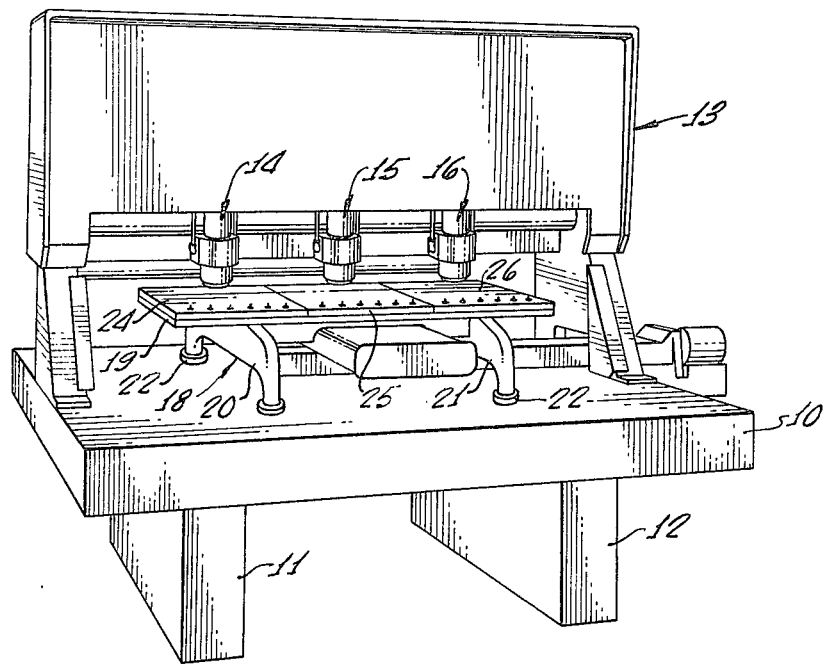
FIG. 1 is a perspective view of an automatic drilling machine which uses the drill changing arrangement of this invention.

The automatic drilling machine illustrated in FIG. 1 includes a horizontal granite surface plate 10 mounted on vertical support blocks 11 and 12, also of granite. A bridge assembly 13 is positioned above the plate 10 carrying three spindle assemblies 14, 15 and 16. These assemblies are movable vertically as the machine operates.

Beneath the drill spindle assemblies 14, 15 and 16 is a work table assembly 18 having a flat horizontal upper plate 19 carried by end supports 20 and 21. Each of the latter elements has two air bearing shoes 22 on the upper surface of the granite plate 10. A suitable mechanism, not shown, can drive the work table assembly 18 to predetermined positions relative to the granite surface plate 10 and, of course, relative also to the spindle assemblies 14, 15 and 16. This movement is in two directions horizontally of the machine, one being longitudinally of the granite surface plate 10, and the other transversely of the plate 10, and is controlled by a computer. Tooling plates are carried by the work table plate 19, in the embodiment illustrated there being three tooling plates 24, 25 and 26, one for each of the spindle assemblies 14, 15 and 16. The tooling plates carry the workpieces to be drilled, normally printed circuit boards.

Figure 2:
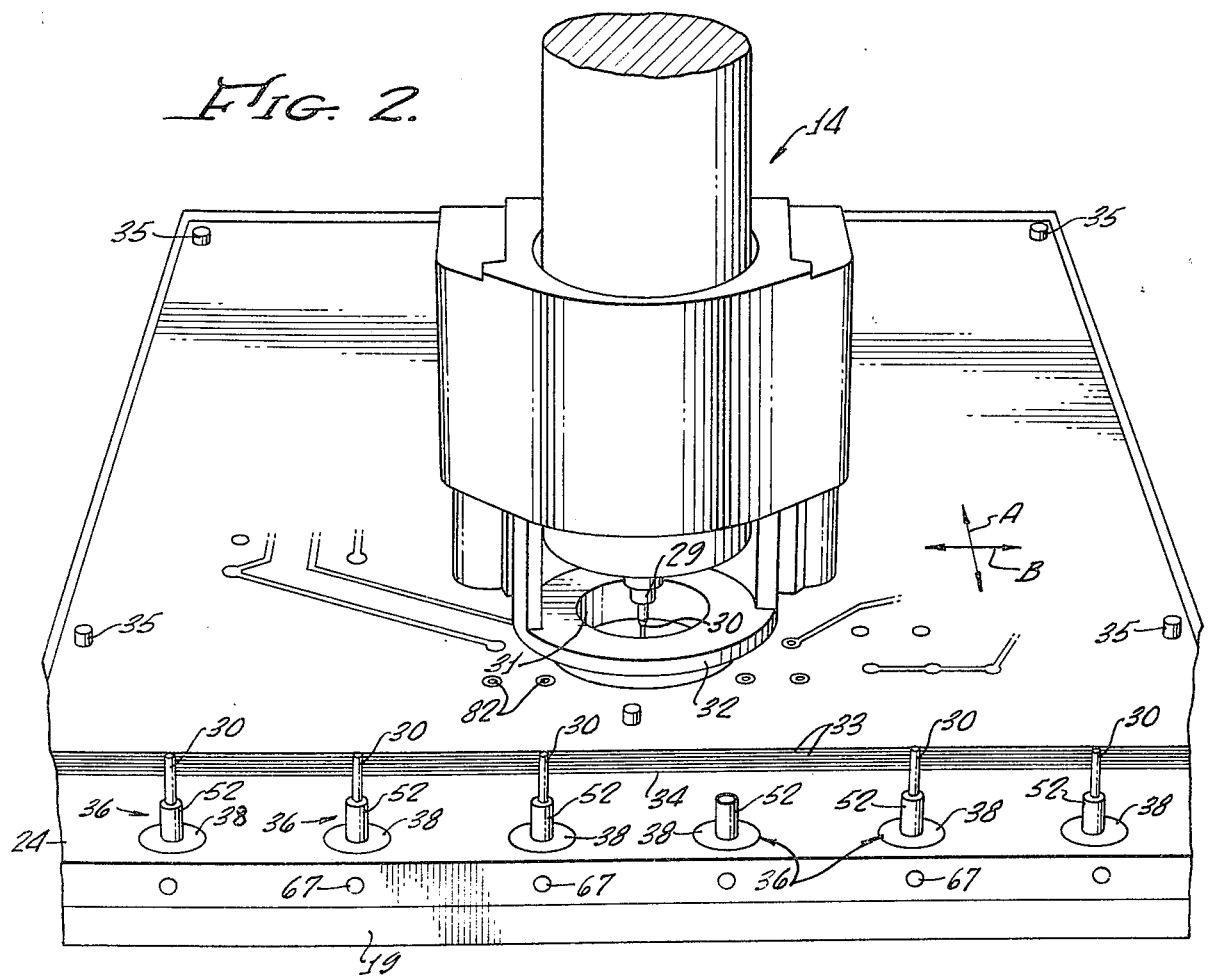
FIG. 2 is an enlarged fragementary perspective view of the portion of the machine of FIG. 1 associated with one of the spindles of the machine.

As shown in FIG. 2, the spindle assembly 14, which is similar to the other spindle assemblies, includes a rotatable collet 29 which carries a drill 30 within an opening 31 in a pressure foot 32. Beneath the spindle assembly 14 is a stack of printed circuit boards 33 superimposed on a backup board 34 resting on the tooling plate 24. The printed circuit boards 33 and backup board 34 are held together by pins 35 which fit tightly in openings through these boards and extend into openings in the tooling plate to position the boards.

In operation of the machine, the work table moves the tooling plate 24 in the directions indicated by the arrows A and B, as controlled by a computer, to bring predetermined locations of the printed circuit boards 33 beneath the spindle assembly 14. The pressure foot 32 then is pressed down on the printed circuit boards and the collet 29 moved vertically by the spindle to cause the drill 30 to drill an opening at the selected location of the stacked printed circuit boards. In this manner, an established pattern of openings may be formed in the stack of printed circuit boards 33. Openings of different sizes may be drilled in the printed circuit boards, automatically and in a continuous operation, through the use of the drill changers 36 of this invention, which are positioned in a row along the forward edge of the tooling plate 24, as illustrated in FIG. 2. Similar drill changer assemblies also will be provided for the other tooling plates 25 and 26. In the embodiment shown there are six of the drill changer assemblies 36 for the tooling plate 34, enabling the machine to drill openings of six different diameters.

Each drill changer assembly 36 includes a tubular body 38 having a cylindrical exterior surface 39 with an annular groove 40 intermediate its ends. Internally the body 38 includes a cylindrical bore 41 for a major portion of its length, terminating at a narrow radial flange 42 at the upper end 43 of the body. A counterbore 44 extends inwardly from the lower end 45 of the body 38, connecting to a radial shoulder 46 that extends to the lower end of the bore 41. Received within the counterbore 44 is a disc 47 that fits tightly into the counterbore and is secured to the body 38 at that location. The upper end 48 of the disc 47 abuts the radial shoulder 46 of the body 38. The bore 49 of the disc 47 is of the same diameter as the bore 41 of the body 38 and forms a continuation of the bore 41. At the lower end of the assembly, the bore 49 of the disc 47 terminates at a radial flange 50.

The lower end of a gripping sleeve 52 is received within the bore 41, having a cylindrical exterior surface 53 substantially complementary to the bore so that the gripping sleeve 52 is axially slidable relative to the bore, which guides it in a vertical path. The upper portion of the sleeve 52 has a cylindrical exterior surface 54 slightly smaller than the surface 53, resulting in a transverse shoulder 55 between the surfaces 53 and 54. The diameter of the upper portion 54 is complementary to the internal diameter of the flange 42 at the upper end of the body 38. Four axial slots 56, equally spaced apart, extend for the length of the upper portion of the sleeve 52. The sleeve is made of resilient material, such as beryllium copper, so that the four sections of the upper portion resulting from the slots 56 can act as leaf springs.

Internally, the gripping sleeve 52 has a bore 57 of constant diameter for the major portion of its length. Spaced inwardly a short distance from the upper end 58 of the gripping sleeve 52 is a short bore portion 59 which is larger than the bore 57 and connects to it through a radial shoulder 60. A beveled surface 61 extends from the upper end 58 of the gripping sleeve 52 to the upper bore portion 59.

A compression sping 62 has its lower end in the bore 49 of the insert disc 47, bearing against the flange 50. The upper end of the spring 62 extends into the bore 41 and engages the lower end 63 of the gripping sleeve 52. This provides a resilient force on the gripping sleeve 52, biasing it upwardly to the position shown in FIG. 5 where the shoulder 55 of the gripping sleeve engages the flange 42 of the body 38. The flange 42 and shoulder 55 thereby act as abutments that limit the upward movement of the sleeve 52.

The body 38 is received in a complementary opening 65 in the tooling plate 24, extending the full length of the opening 65 so that the lower end 45 of the body 38 is in juxtaposition with the upper surface 66 of the work table plate 19. A set screw 67 is received in a tapped opening 68 in the tooling plate 24 with its inner end entering the annular groove 40 of the body 38. This prevents the body 38 from being withdrawn from the opening 65 in the tooling plate 24.

Beneath and aligned with the drill changer assembly 36 is an opening 69 in the work table plate 19. The latter opening is of a greater diameter than that of the inner edge of the flange 50 of the insert disc 47, but is narrower than the outside diameter of the disc 47.

Figures 3, 4, 5, 6:
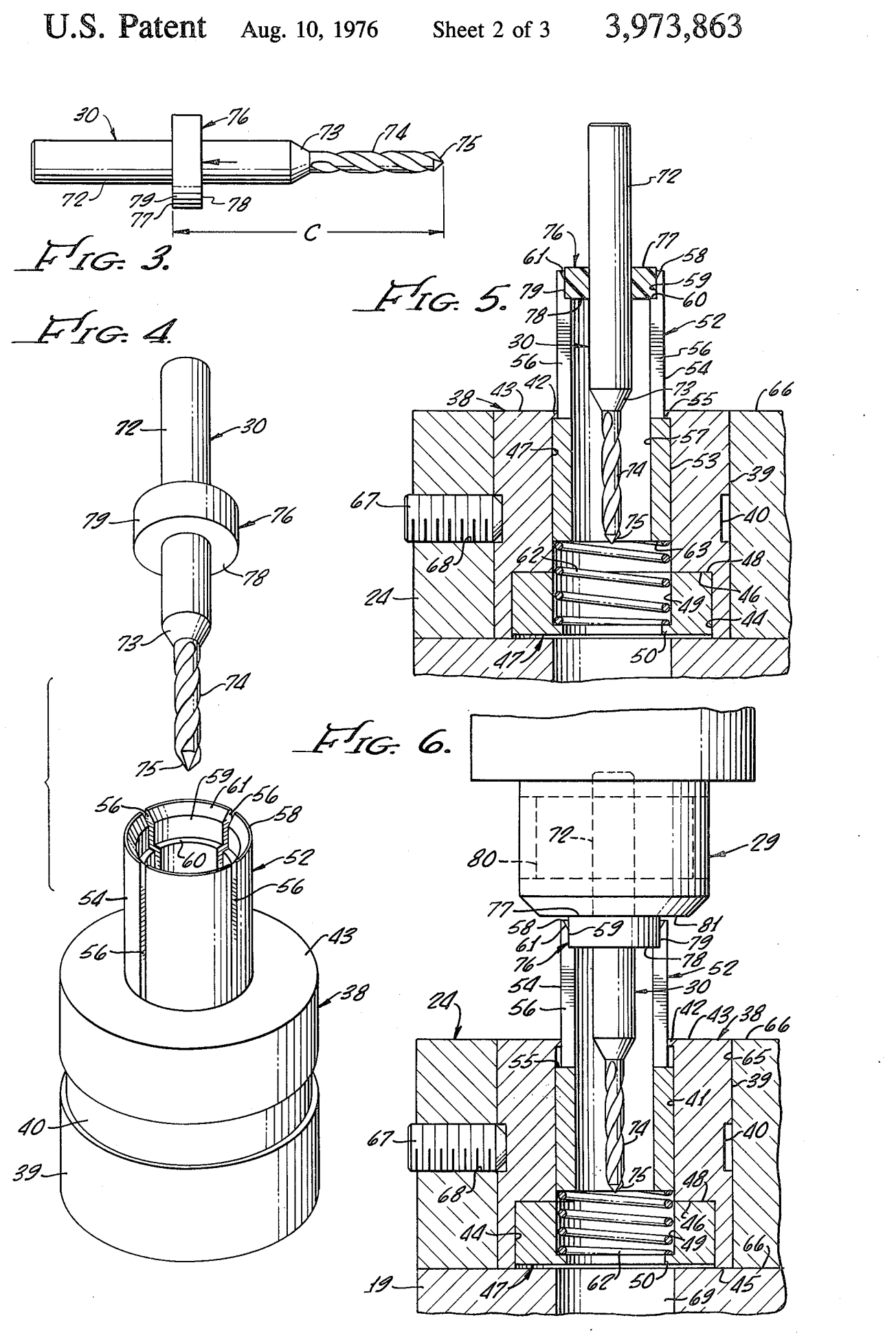

The drill 30, shown in particular of FIGS. 3, 4 and 5, has a cylindrical shank 72 of constant diameter connecting through a frustoconical portion 73 to a fluted end portion 74 that terminates at a conical tip 75. For automatic drilling machines, all of the drill bits have shanks of the same diameter for being gripped by the collet 29. The bottom fluted portions, however, are made to different diameters to enable holes of different sizes to be drilled.

A collar 76 is fitted around and frictionally grips the shank 72 at a predetermined location. This is to position the upper radial end surface 77 of the collar at a predetermined distance C from the apex of the tip 75 of the drill, as indicated in FIG. 3. The collar 76 is suitably made of nylon and has a free inside diameter less than the diameter of the shank 72. Therefore, when the collar 76 is forced over the shank, it exerts a compressive force on the shank and will maintain its position along the shank.

The drill 30 is associated with the drill changer assembly 36 in the manner shown in FIG. 5 preparatory to being picked up by the collet 29 for the drilling operation. The collar 76 fits within the bore 59 of the sleeve 52 with the bottom end 78 of the collar engaging the shoulder 60. The upper end surface 77 of the collar 76 then projects a short distance above the upper end 58 of the sleeve 52. The outer diameter of the collar 76 is slightly greater than the inside diameter at the bore 59, so that the bore 59 is opened up as permitted by the slots 56 of the sleeve 52 and the circumferential surface 79 of the collar is frictionally gripped by the sleeve. The beveled surface 61 provides an entrance into the bore 59 for the collar 76 so that the collar easily enters the bore 59 without obstruction.

The drilling machine is programmed so that the work table 18 moves to shift the unit 36 to a position of alignment with the spindle assembly 14, with the collet 29 being empty and elevated at that time. The collet 29, in its open position, then is moved vertically downwardly so that the upper portion of the drill shank 72 is received within the collet. The jaws 80 of the collet then are closed, gripping the drill which then is removed from the drill changer assembly 36.

The height of the drill changer assembly 36 is proportioned with respect to the stroke of the collet 29 such that when the collet is at its lower terminus, its lower end surface 81 engages the upper surface 77 of the collar 76. Engagement of these surfaces is assured by providing for a short overtravel of the collet downwardly. This movement of the collet, acting through the collar 76 and the shoulder 60, then compresses the spring 62 and displaces the sleeve 52 downwardly, as shown in FIG. 6. This means that in all instances the lower end 81 of the collet engages the upper surface 77 of the collar and the tip 75 of the drill is spaced from the collet a predetermined distance. There is no tendency to shift the position of the collar 76 on the shank 72 as the sleeve 52 is displaced because the downward force of the collet is absorbed by the collar and not the drill 30. The accuracy of the setting of the collar 76 relative to the tip 75 of the drill is not disturbed.

The machine then operates to cause the stack of printed circuit boards 33 to be positioned beneath the spindle 14 at appropriate locations so that the drill 30 will drill holes as required as the collet moves upwardly and downwardly. At the lower end of the stroke, as seen in FIG. 7, the entire tip end 75 of the drill 30 extends into the composition backup board 34 beneath the printed circuit boards 33. This is to assure that all of the printed circuit boards, including the bottom one, are drilled completely through on each stroke. With the exact distance between the lower end 81 of the collet and the tip 75 of the drill being established and set in correlation with the stroke of the spindle, proper drill penetration is achieved automatically. There is no danger of damage to the machine as can be caused by extending the drill too far, which may then cut openings in the surface of the tooling plate.

When all of the openings to be drilled by the drill 30 have been formed, the machine then returns the drill 30 to its drill changer assembly 36. This is accomplished by raising the collet 29 and shifting the work table so as to position the collet above the assembly 36. The collet is then lowered, inserting the drill with its collar 76 into the sleeve 52, assuming again the position of FIG. 6. The jaws 80 of the collet then release the shank 72 of the drill and the collet is raised. The drill is retained in the sleeve 52 because of the gripping action of the slotted upper portion 54 of the sleeve which holds onto the periphery 79 of the collar 76 by friction at the surface 58 of the sleeve. The movement permitted the sleeve 52 relative to the body 38 protects against damage upon return of the drill just as it did when the drill was picked up. The collet can force the sleeve 52 downwardly against the force of the spring 62 in assuring that the collar is received in the bore 58 without in any way harming the components of the machine.

NOrmally there will be a number of drills of different sizes positioned in the various drill changer assembly 36 at the forward edge of the tooling plate 24, as shown in FIG. 2. The machine operates to obtain the appropriately sized drill, automatically drill the required holes of the diameter of that drill and then return that drill to its drill changer assembly, following which another size drill is picked up and used. In this manner the printed circuit board may be given holes of several different sizes, such as the openings 82, 83, 84 and 85 indicated in FIG. 8.

The arrangement of this invention protects against damage to the machine from malfunction in which the machine improperly would attempt to return a drill to a drill changer assembly already occupied by a drill. If this should occur, the drill already positioned in the drill changer assembly 36 merely will be driven downwardly out of its collar 76 and through the sleeve 52 into the opening 69 in the work table plate 19, as indicated in FIG. 9. The oncoming drill can enter the sleeve 52, causing additional compression of the spring 49 as its collar 76 engages the remaining collar 76. The sleeve 52 is premitted ample travel to allow for this additional movement. Accordingly, there is free movement of the spindle through its vertical stroke so that damage to the spindle assembly is avoided.

The foregoing detailed description is to be clearly understood as given by way of illustration and example only, the spirit and scope of this invention being limited solely by the appended claims.

I claim:

1. In combination with a drilling machine having a collet having an end surface, and a drill having a shank at one end and a cutting tip at the opposite end, a device for allowing said collet to selectively engage said shank for a drilling operation, and to remove said shank from said collet, comprising a collar on said shank,
said collar having a surface adjacent said tip and having a surface remote from said tip spaced a predetermined distance from said tip,
and holding means for holding said collar and positioning said drill in a predetermined position alignable with said collet, said holding means including
a movable element engaging said collar, said movable element having an abutment means engaged by said surface of said collar adjacent said tip for thereby axially positioning said drill, said surface of said collar remote from said tip facing outwardly so as to be engageable by said end surface of said collet, said movable element being movable between a first position and a second position,
and resilient means biasing said element toward said first position,
whereby when said surface of said collar is so engaged by said end surface of said collet, said element is movable from said first position toward said second position.

2. A device as recited in claim 1 which said surface of said collar remote from said tip is exteriorly of said movable element.

3. A device as recited in claim 1 in which said holding means includes friction means for gripping said collar for retaining said collar upon release of said shank by said collet.

4. A device as recited in claim 3 in which said movable element includes
a slotted sleeve of resilient material, said slotted sleeve having a wall frictionally engaging the periphery of said collar for thereby providing said friction means.

5. A device as recited in claim 4 in which said abutment means includes a shoulder in said slotted sleeve,
said surface of said collar adjacent said tip engaging said shoulder for positioning said drill axially of said holding means.

6. A device as recited in claim 5 in which said slotted sleeve includes an inwardly tapering entrance leading to said wall thereof, for facilitating entry of said collar into said sleeve for said engagement with said shoulder.

7. A device as recited in claim 5 which
said holding means includes a fixed support having an opening therein slidably receiving said slotted sleeve,
and in which said resilient means includes a compression spring engaging said fixed support and said slotted sleeve for biasing said slotted sleeve toward said first position.

8. A device as recited in claim 7 in which said fixed support includes abutment means, and in which said slotted sleeve includes abutment means, said abutment means of said fixed support and said slotted sleeve being in interengagement when said element is in said first position thereof.

9. In combination with a drilling machine having a collet having an end surface, and a drill having a shank at one end and a cutting tip at the opposite end, a device for allowing said collet to selectively engage said shank for a drilling operation, and to receive said drill from said collet following a drilling operation, comprising a collar on said shank, said collar having a first transverse surface remote from said tip which is spaced a predetermined distance from said tip,
a second transverse surface adjacent said tip, and
a third circumferential surface intermediate said first and second surfaces,
a body adapted for connection to fixed portions of a drilling machine, said body having
an opening therein and an abutment
a sleeve substantially complementarily received in said opening and axially movable therein,
said sleeve having an abutment engageable with said abutment of said body for limiting said movement of said sleeve in one direction,
a portion of said sleeve adjacent one end thereof projecting from said body,
said portion adjacent one end of said sleeve including an enlarged bore portion and a shoulder at the inner end of said enlarged bore portion,
said portion adjacent one end of said sleeve being of resilient material and having axial slot means therein,
said enlarged bore portion being adapted to receive said collar with said second surface of said collar engaging said shoulder and said shank projecting outwardly from said sleeve for engagement of said first surface of said collar by said end of said collet and gripping of said shank by said collet,
said enlarged bore portion between said shoulder and said one end being shorter than the axial length of said collar, whereby when said second surface of said collar so engages said shoulder said first surface of said collar is outside of said enlarged bore portion,
said enlarged bore portion having a diameter smaller than that of said third surface of said collar, whereby said end portion of said sleeve frictionally grips said third surface when said collar is so received in said enlarged bore portion,
and resilient means biasing said sleeve in said one direction to normally cause said abutment of said sleeve to engage said abutment of said body,
said resilient means being adapted to yield to the force of said collet against said collar when said end of said collet so engages said first surface of said collet.

10. A device as recited in claim 9 in which said sleeve includes a tapered surface extending inwardly from said one end of said sleeve toward said enlarged bore portion for facilitating entry of said collar into said enlarged bore portion.

11. A device as recited in claim 10 in which said resilient means is a compression spring one end of which engages said body and the opposite end of which engages the opposite end of said sleeve.

* * * * *